US008186410B2

(12) United States Patent
Nakamura et al.

(10) Patent No.: US 8,186,410 B2
(45) Date of Patent: May 29, 2012

(54) SEPARATING DEVICE

(75) Inventors: Akihiko Nakamura, Kawasaki (JP);
Junichi Katsuragawa, Kawasaki (JP);
Atsushi Miyanari, Kawasaki (JP);
Yoshihiro Inao, Kawasaki (JP);
Yasumasa Iwata, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 136 days.

(21) Appl. No.: 12/326,340

(22) Filed: Dec. 2, 2008

(65) Prior Publication Data
US 2009/0139662 A1    Jun. 4, 2009

(30) Foreign Application Priority Data
Dec. 3, 2007 (JP) .................................. 2007-312867

(51) Int. Cl.
*B32B 38/00* (2006.01)

(52) U.S. Cl. ........ 156/750; 156/701; 156/703; 156/930; 156/941; 269/21; 279/3; 248/309.3

(58) Field of Classification Search .................. 156/584, 156/344, 701, 703, 750, 930, 941; 269/21; 279/3; 248/309.3
See application file for complete search history.

(56) References Cited

U.S. PATENT DOCUMENTS

| | | | | |
|---|---|---|---|---|
| 5,427,644 A * | 6/1995 | Nagatsuka et al. | ............ | 156/344 |
| 6,238,515 B1 * | 5/2001 | Tsujimoto et al. | ......... | 156/379.8 |
| 6,336,787 B1 * | 1/2002 | Chang et al. | .................. | 414/800 |
| 6,551,403 B1 * | 4/2003 | Crabtree | ........................ | 118/313 |
| 6,569,282 B1 * | 5/2003 | Arisa | ........................ | 156/345.21 |
| 6,629,553 B2 * | 10/2003 | Odashima et al. | ............ | 156/584 |
| 6,792,991 B2 * | 9/2004 | Thallner | ........................ | 156/539 |
| 7,211,168 B2 | 5/2007 | Miyanari | | |
| 2003/0088959 A1 * | 5/2003 | Tsujimoto | .................... | 29/25.01 |
| 2005/0173064 A1 | 8/2005 | Miyanari | | |

(Continued)

FOREIGN PATENT DOCUMENTS
JP    2004-056122 A    2/2004
(Continued)

OTHER PUBLICATIONS
Office Action for Japanese Application No. 2007-312867 mailed Sep. 27, 2011.

*Primary Examiner* — Mark A Osele
*Assistant Examiner* — Nickolas Harm
(74) *Attorney, Agent, or Firm* — Nixon & Vanderhye PC

(57) ABSTRACT

A separating device according to the present invention separates a support plate (14) from a substrate (12) of a laminate (10) including the substrate (12) and the support plate (14) bonded to each other. The separating device includes: a first storing section (20) for storing the laminate (10); a plurality of first processing sections (30) for reducing adhesive force of an adhesive (13) applied between the substrate (12) and the support plate (14); and a first carrying section (50) which is capable of moving in the first direction and carries the laminate (10) from the first storing section (20) to the first processing section (30) while holding the laminate (10). With the first carrying section (50), it is possible to provide a separating device (100) which moves straightly so as to carry the laminate (10). This provides a separating device for (i) processing a laminate including a substrate and a support plate and (ii) separating the support plate from the substrate, which separating device performs the separating process efficiently.

16 Claims, 5 Drawing Sheets

U.S. PATENT DOCUMENTS

| | | | |
|---|---|---|---|
| 2005/0205204 A1* | 9/2005 | Kurosawa et al. | 156/344 |
| 2005/0236114 A1* | 10/2005 | Yanagita et al. | 156/584 |
| 2006/0042747 A1* | 3/2006 | Song et al. | 156/285 |
| 2006/0219359 A1* | 10/2006 | Miyamoto et al. | 156/344 |
| 2006/0231202 A1* | 10/2006 | Sakata et al. | 156/344 |
| 2007/0151674 A1 | 7/2007 | Miyanari | |
| 2008/0044258 A1 | 2/2008 | Akechi | |

FOREIGN PATENT DOCUMENTS

| | | |
|---|---|---|
| JP | 2004-200726 A | 7/2004 |
| JP | 2006-156633 A | 6/2006 |

* cited by examiner

SEPARATING DEVICE

This Nonprovisional application claims priority under U.S.C. §119(a) on Patent Application No. 312867/2007 filed in Japan on Dec. 3, 2007, the entire contents of which are hereby incorporated by reference.

FIELD OF THE INVENTION

The present invention relates to a separating device for separating a support plate from a substrate which constitutes a laminate including (i) the substrate and (ii) the support plate for supporting the substrate.

BACKGROUND OF THE INVENTION

A mobile phone, a digital AV device, an IC card, and the like have higher functions. This increases a demand for having a higher density chip inside a package by reducing a size and a thickness of a semiconductor silicon chip (hereinafter, referred to as a chip) to be mounted on these devices. In order to have the higher density chip inside the package, the thickness of the chip should be reduced so as to be within a range from 25 μm to 150 μm.

However, if a semiconductor wafer (hereinafter, referred to as a wafer), which is a base of the chip, is ground and thereby reduces its thickness, the wafer reduces its strength and is apt to have a crack or to be curved. The wafer whose strength has been reduced due to the reduction in its thickness is difficult to be conveyed in an automated manner. Instead, such the wafer should be conveyed manually by a person. This gives the person troublesome procedures.

In view of this, a wafer supporting system has been developed. According to the wafer supporting system, a so-called support plate, which is made of materials such as glass and hard plastic, is bonded to a wafer which is to be ground. This allows the wafer to maintain its strength, thereby preventing the wafer from having a crack or being curved. Because the wafer supporting system allows a wafer to maintain its strength, it is possible to convey, in an automated manner, a semiconductor wafer whose thickness has been reduced.

The wafer and the support plate are bonded to each other by means of adhesive tape, a thermoplastic resin, an adhesive, or the like. Before the wafer is subjected to dicing, the support plate is separated from a substrate. In a case where the wafer and the support plate are bonded to each other by means of the adhesive tape, the wafer is separated from the support plate by ripping out the support plate from the wafer. In a case where the wafer and the support plate are bonded to each other by means of the thermoplastic resin, the wafer is separated from the support plate by heating and melting the resin. In a case where the wafer and the support plate are bonded to each other by means of the adhesive, the wafer is separated from the support plate by means such as dissolving the adhesive by using a dissolving solution.

Before the support plate is separated from the wafer in the manner as described above, a side of the wafer which side is not bonded to the support plate is bonded to another support member such as a dicing tape, depending on a thickness of the wafer. This is necessary because the wafer has a low strength due to its small thickness and thereby is apt to have a crack. That is, a laminate is once formed by a dicing tape, a substrate, and a support plate, and then the support plate is separated from the substrate.

Japanese Unexamined Patent Application Publication, Tokukai, No. 2006-135272 (published on May 25, 2006) discloses such an arrangement that (i) a wafer and a support plate are bonded to each other by means of an adhesive, (ii) the adhesive is dissolved by using a dissolving solution, and (iii) the support plate is separated from the wafer. In this publication, the support plate bonded to the wafer has a through-hole, through which the dissolving solution is supplied to the adhesive, and then the wafer is separated from the support plate.

SUMMARY OF THE INVENTION

However, a separating device which adopts the foregoing separating method and in which the whole separating process is automated has not been developed yet. The present invention was made in view of the problem, and an object of the present invention is to provide a separating device (i) which separates a support plate from a substrate constituting a laminate including (a) the substrate and (b) the support plate for supporting the substrate and (ii) in which processing efficiency is improved.

A separating device according to the first embodiment of the present invention is for separating a support plate from a substrate of a laminate including the substrate and the support plate bonded to each other, the separating device including: a first storing section for storing the laminate; a plurality of first processing sections for reducing adhesive force of an adhesive applied between the substrate and the support plate; and a first carrying section which is capable of moving in a first direction and carries the laminate from the first storing section to the first processing sections while holding the laminate, the first carrying section carrying the laminate by moving straightly.

The separating device according to the first embodiment of the present invention includes the first carrying section which moves straightly. This allows various processing sections to be provided along the running path of the first carrying section. This makes it possible to provide a separating device which can perform a separating process efficiently.

A separating device according to the second embodiment of the present invention is for separating a support plate from a laminate including a substrate and the support plate bonded to each other, the separating device including: a first storing section for storing the laminate; a first processing section for reducing adhesive force of an adhesive applied between the substrate and the support plate; a second storing section for storing the support plate which has been separated from the substrate; a first carrying section for carrying the laminate from the first storing section to the first processing section while holding the laminate; and a second carrying section for carrying, to the second storing section, the support plate which has become removable as a result of the reduction in the adhesive force of the adhesive, the reduction being performed by the first processing section.

The separating device according to the second embodiment of the present invention includes the second carrying section for separating the support plate whose adhesive force has been reduced. This allows the support plate whose adhesive force has been reduced to be carried in an automated manner. This makes it possible to provide a separating device which can perform a separating process efficiently.

Additional objects, features, and strengths of the present invention will be made clear by the description below. Further, the advantages of the present invention will be evident from the following explanation in reference to the drawings.

DESCRIPTION OF THE EMBODIMENTS

The following describes one embodiment of the present invention.

[Laminate]

Figure 4:
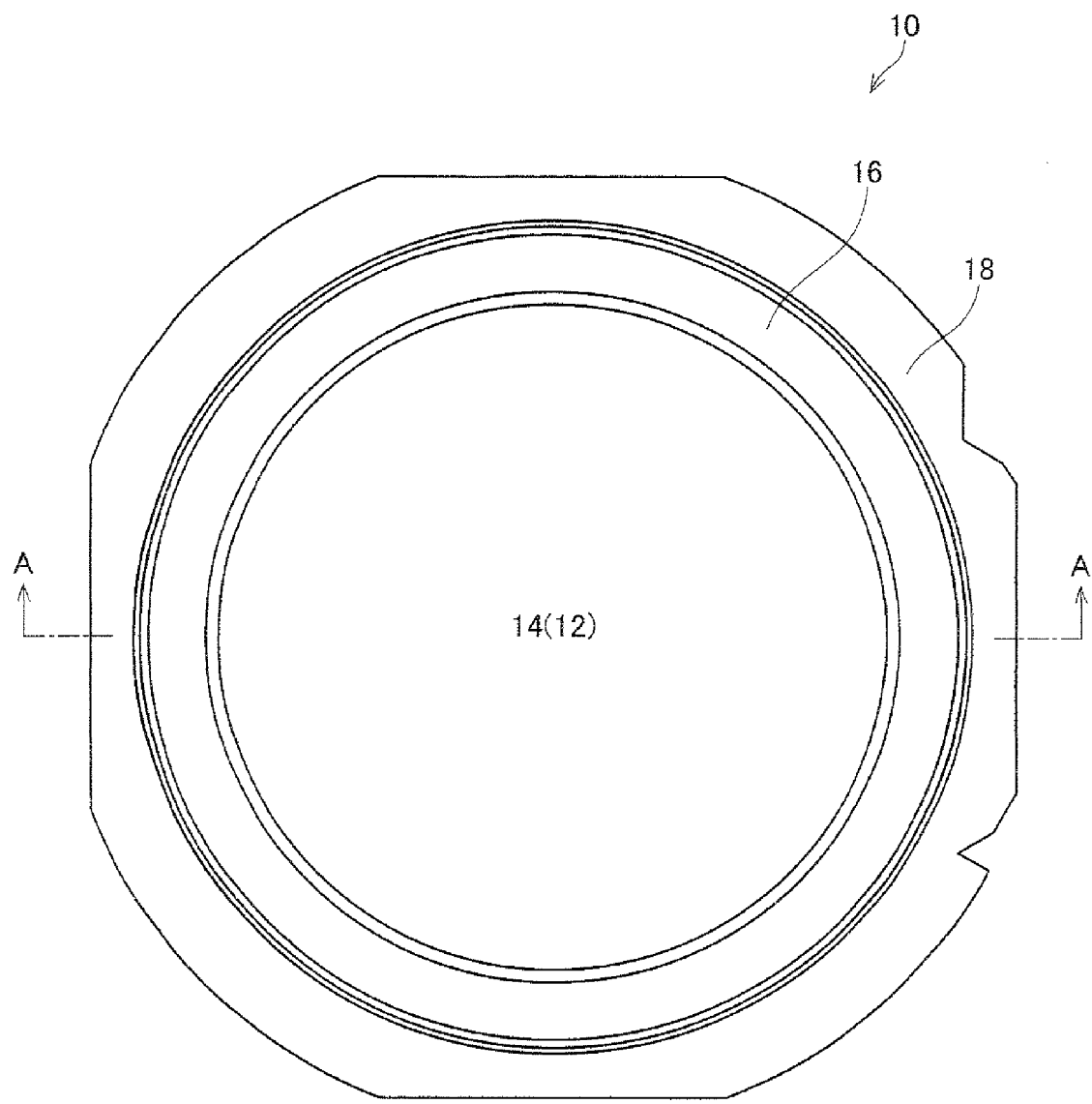
FIG. 4 is a top view of a laminate to be processed by the separating device according to one embodiment of the present invention.
Figure 5:
FIG. 5 is an A-A cross-section view of FIG. 4.

Firstly, the following describes, with reference to FIG. 4 and FIG. 5, a laminate 10, which is a subject to be processed by a separating device 100 according to the present embodiment. FIG. 4 is a top view of the laminate 10, and FIG. 5 is an A-A cross-section view of FIG. 4.

The subject to be processed is, as illustrated in FIG. 4 and FIG. 5, the laminate 10 including a substrate 12 and a support plate 14. The substrate 12 and the support plate 14 are bonded to each other via an adhesive 13. The substrate 12 may be used alone, or may be used in combination with a dicing tape 16. In a case where the substrate 12 is used in combination with the dicing tape 16, the dicing tape 16 is adhered to the substrate 12. In the present embodiment, the following case is described as an example: the dicing tape 16 is adhered to a surface of the substrate 12 to which surface the support plate 14 is not bonded. A rim of the dicing tape 16 is held by a dicing frame 18 so as not to be loosened up.

The substrate 12 may be, for example, a thinned semiconductor wafer. A thickness of the substrate 12 included in the laminate 10 may be in a range from 10 μm to 150 μm.

The support plate 14 supports the substrate 12. Specifically, the support plate 14 supports a substrate while the substrate is subjected to a grinding process for obtaining a substrate 12, that is, a thinned substrate. It is preferable for the support plate 14 to have a size which is equal to or more than a size of a surface of the substrate 12 which surface is not to be ground. Further, it is more preferable for the support plate 14 to have a size which is equal to the size of the surface of the substrate 12 which surface is not to be ground.

The support plate 14 is not limited to any particular type, but only needs to be capable of supporting the substrate 12 while the substrate 12 is subjected to a process for reducing the thickness of the substrate 12. However, in a case of using, as means for reducing adhesive force of an adhesive, a solvent which dissolves the adhesive, it is preferable for the support plate 14 to have (i) a through-hole (not illustrated) in a direction of a thickness of the support plate, (ii) a groove (not illustrated) on a side wall of the support plate, or (iii) both of the through-hole and the groove, for the purpose of making it easier for the solvent to come in contact with the adhesive. It is especially preferable for the support plate 14 to have the through-hole. The through-hole is for supplying the solvent therethrough, for the purpose of dissolving the adhesive 13 between the substrate 12 and the support plate 14. For example, a glass substrate 12 having a through-hole is possible. It is preferable for the support plate 14 to have almost the same shape as that of a surface of the substrate 12 to which surface the support plate 14 is to be bonded. Further, it is preferable for the support plate 14 to have a plurality of through-holes. Furthermore, it is preferable that the plurality of through-holes are provided on the whole surface of a first support plate 14 uniformly and dispersedly. This is because this arrangement facilitates penetration of a solvent into an adhesive. For example, it is preferable that a diameter of the through-hole is in a range from 0.3 mm to 0.5 mm, and an interval between the through-holes is in a range from 0.5 mm to 1.0 mm. The support plate 14 may be made of glass, hard resin, Si, ceramic, or the like.

[Separating Device]

Figure 1:
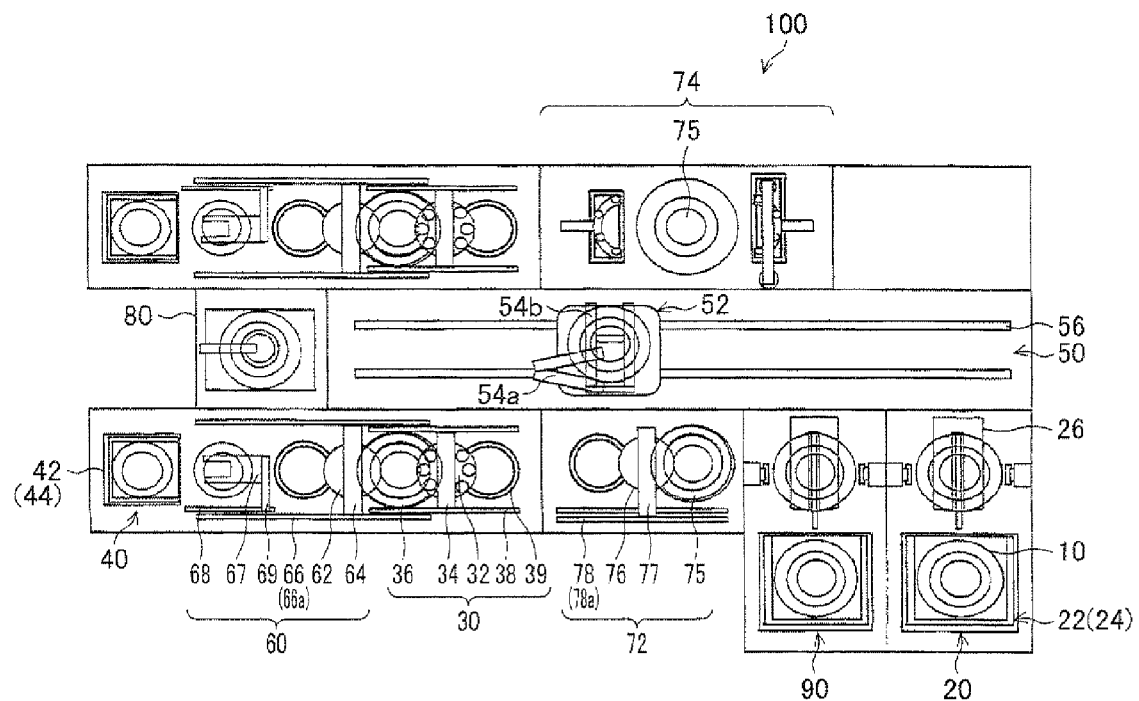
FIG. 1 is a top view of a separating device according to one embodiment of the present invention.
Figure 2:
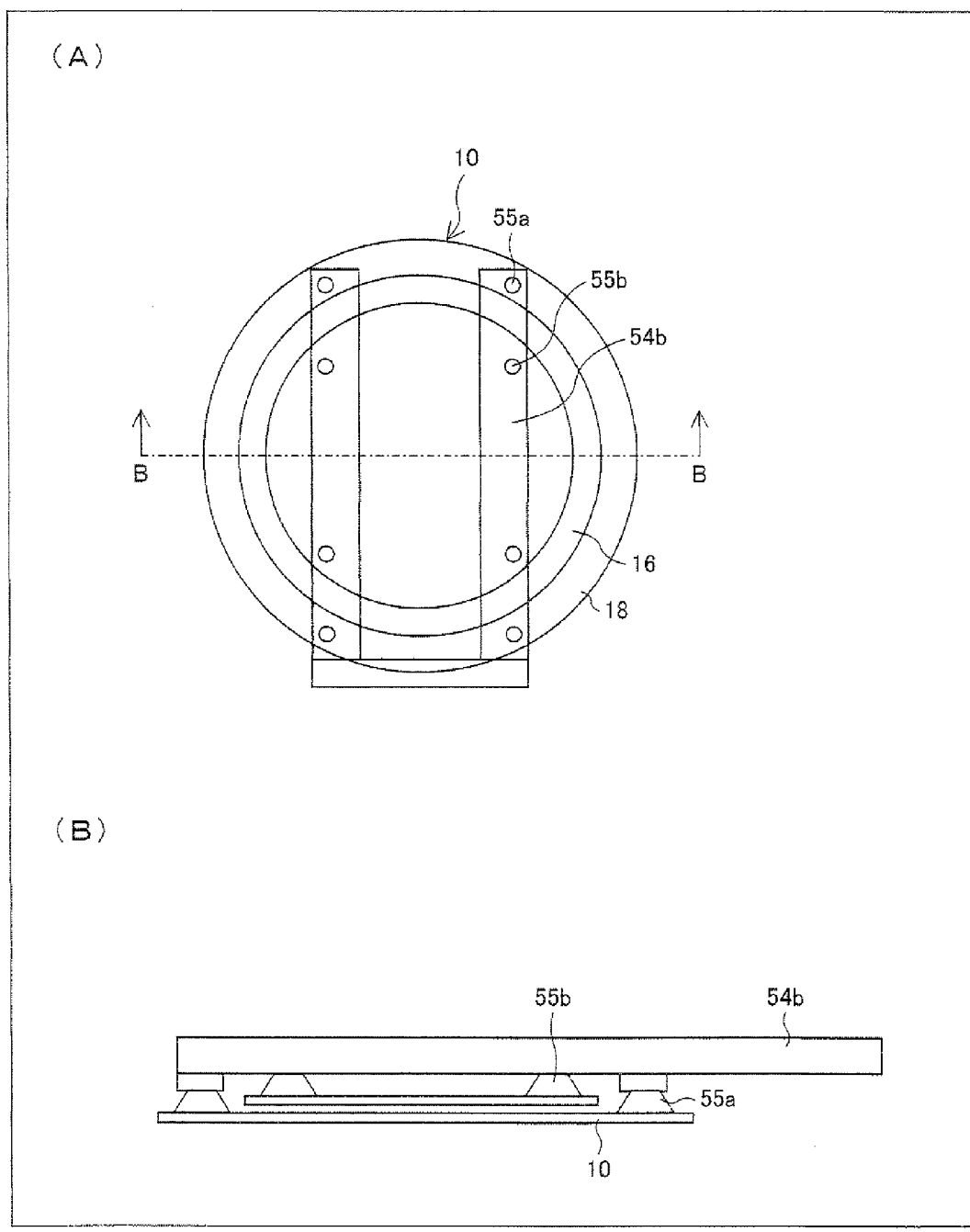
FIG. 2(A) is a top view illustrating a hand 54b of a first carrying section 50 included in the separating device according to one embodiment of the present invention.
FIG. 2(B) is a B-B cross-section view of FIG. 2(A).

Next, the following describes, with reference to FIG. 1 and FIG. 2, the separating device 100 according to the present embodiment. FIG. 1 is a top view of the separating device 100 according to the present embodiment. FIG. 2 illustrates a hand of a carrying robot 52 included in the separating device 100 according to the present embodiment. FIG. 2(A) is a top view of the hand of the carrying robot 52, and FIG. 2(B) is a B-B cross-section view of FIG. 2(A).

The separating device 100 according to the present embodiment includes: a first storing section 20 for storing the laminate 10; a plurality of first processing sections 30 for reducing adhesive force of an adhesive applied between the substrate 12 and the support plate 14; a second storing section 40 for storing the support plate 14 which has been separated from the substrate 12; a first carrying section 50 which is capable of moving in the first direction and carries the laminate 10 from the first storing section 20 to the first processing section 30 while holding the laminate 10. Further, the separating device 100 according to the present embodiment may include: a second carrying section 60 for carrying the substrate 12 from the first processing section 30 to the second storing section 40; a second processing section 70 for cleaning the substrate 12; and an aligning section 80. The description herein deals with, as an example, the separating device 100 according to the present embodiment including the second carrying section 60, the second processing section 70, and the aligning section 80. In the present embodiment, a first cleaning unit 72 or a second cleaning unit 74 (described later) may be called as the second processing section 70.

Firstly, the following schematically describes, in order, how the separating device 100 processes the laminate 10. In the separating device 100 according to the present embodiment, the laminate 10 is carried from the first storing section 20, which stores the laminate 10, to the first processing section 30 by the first carrying section 50. At this time, it is preferable that the laminate 10 taken out from the first storing section 20 is aligned by the aligning section 80 (described later) before the laminate 10 thus taken out is carried to the first processing section 30.

Subsequently, the first processing section 30 reduces adhesive force of the adhesive 13 between the substrate 12 and the support plate 14 by applying a solvent or other means. At this time, although the adhesive force of the adhesive 13 between the substrate 12 and the support plate 14 is reduced, the support plate 14 is still placed on the upper side of the substrate 12. Then, the second carrying section 60 removes, from above, the support plate 14 from the substrate 12, the support plate 14 having become removable. (The separating process includes (i) reducing the adhesive force of the adhesive 13 and (ii) removing the support plate from the substrate.) Then, the support plate 14 thus removed is stored in the second storing section 40. On the other hand, the substrate 12, from which the support plate 14 has been separated, is carried to the second processing section 70 by the first carrying section 50. The second processing section 70 cleans the substrate 12. In the cleaning process, the second processing section 70 cleans a surface of the substrate 12 to which surface the support plate 14 was faced. Then, the substrate 12 is carried, by the first carrying section 50, to a third storing section 90 for storing a substrate from which a support plate has been separated.

With the separating device 100 according to the present embodiment, it is possible to complete the separating process between the substrate 12 and the support plate 14 (i.e., the process in which the support plate is removed from the laminate 10), without tuning around the laminate 10, turning around the support plate, or the like.

[First Storing Section 20 and Third Storing Section 90]

The first storing section 20 stores the laminate 10 to be processed by the separating device 100. Specifically, the first storing section 20 includes a cassette station (a region to which a cassette 22 is mounted) 24 and the cassette 22 for storing a plurality of laminates 10. The laminates 10 are stored in the cassette 22 while maintaining a predetermined interval between them in the up and down direction. The cassette 22 stores the laminate 10 so that the support plate 14 of the laminate 10 faces up. That is, the cassette 22 stores the laminate 10 so that the dicing tape 16 of the laminate 10 faces down.

The third storing section 90 stores the substrate 12 which has been separated from the support plate 14 by the separating device 100. Specifically, the third storing section 90 has a similar arrangement to that of the first storing section 20. The third storing section 90 includes a cassette station and a cassette. The substrate 12 which has been processed is stored in the cassette while maintaining a predetermined interval in the up and down direction.

[First Processing Section 30]

The first processing section 30 reduces the adhesive force of the adhesive 13 between the substrate 12 and the support plate 14. Means for reducing the adhesive force is not particularly limited. However, means described herein uses a solvent. Specifically, the means includes: a solvent filling plate 32; hold/movement means 34 for supporting the solvent filling plate 32 and enabling the solvent filling plate 32 to move up and down; and a processing table 36 on which a subject to be processed is placed.

Further, as illustrated in FIG. 1, it is preferable for the means to include horizontal movement means 38 for enabling the solvent filling plate 32 to move on a flat surface (horizontal surface). This allows the solvent filling plate 32 to stand by at a position where the solvent filling plate 32 does not overlap the processing table 36 when viewed from above. This arrangement prevents unintended supply of a solvent which occurs when the laminate 10 is placed on the processing table 36.

That is, before the laminate 10 is placed on the processing table 36, the solvent filling plate 32 stands by at a stand-by position 39, which is not a processing position. After the laminate 10 is placed on the processing table 36, the horizontal movement means 38 causes the solvent filling plate 32 to move to a position right above the laminate 10. Subsequently, the hold/movement means 34 causes the solvent filling plate 32 to move so that an appropriate distance can be obtained between the solvent filling plate 32 and the laminate 10. Then, a process is performed.

The solvent filling plate 32 has an opposing surface, which faces the laminate 10. The opposing surface has: a solvent supplying hole (not illustrated) for supplying a solvent by using the through-hole on the support plate 14; and a solvent suction hole (not illustrated) for sucking the solvent which is supplied. An arrangement of the solvent filling plate 32 is not particularly limited, as far as the arrangement allows the solvent filling plate 32 to supply a solvent without having the solvent touch an exposed part of the dicing tape 16 (see FIG. 4), which exposed part is outside the support plate 14 when viewed from above. For example, the following arrangement is possible: (i) the solvent supplying hole is provided at the center of the opposing surface, and the solvent suction hole is provided at a position on the opposing surface which position is the farthest from the center; and (ii) supply and suction of the solvent are performed simultaneously. This arrangement prevents the solvent from touching the dicing tape 16 while the solvent is being supplied. Another example is such that the solvent filling plate 32 has a protruded portion on its circumference so that a distance between the solvent filling plate 32 and the laminate 10 is reduced. This arrangement physically prevents a solvent from being scattered. Further, the solvent filling plate 32 may be provided with an ultrasonic generator for facilitating penetration of a solvent into an adhesive.

In the present embodiment, it is preferable that a plurality of first processing sections 30 are provided. In the separating device 100 according to the present embodiment, the process performed in the first processing section 30 takes the most time. In view of this, providing the plurality of first processing sections 30 improves processing efficiency of the separating device 100 as a whole. In a case where the plurality of first processing sections 30 are provided, it is preferable that the first processing sections 30 are provided so as to sandwich a running path (described later) of the first carrying section 50 therebetween. Arranging the first processing sections 30 as described above allows effective processing.

[Second Storing Section 40]

The second storing section 40 stores the support plate 14 which has been separated from the substrate 12 by the first processing section 30. Specifically, the second storing section 40 includes a cassette 42 and a cassette station 44. The support plate 14 thus separated from the substrate 12 is stored in the cassette 42 while maintaining a predetermined interval in the up and down direction. The support plate 14 which has become removable from the substrate 12 as a result of the process performed by the first processing section 30 is carried to the second storing section 40 by the second carrying section 60 (described later).

[First Carrying Section 50]

The first carrying section 50 carries, while holding the laminate 10 or the substrate 12, the laminate 10 or the substrate 12 between the first storing section 20, the first processing section 30, the second cleaning section 70, and the aligning section 80. The first carrying section 50 includes: the carrying robot 52; and a running path 56 for realizing straight-line movement (i.e., movement in the first direction). Specifically, the carrying robot 52 is rotatable around an axis of the carrying robot 52, and includes two connecting arms 54a and two hands 54b. The connecting arm 54a rotates at its joint so as to elongate and contract. The hand 54b is provided at a tip of the connecting arm 54a, and holds the laminate 10 or the substrate 12. A configuration of the hand 54b will be described in detail later. That is, the carrying robot 52 allows the laminate 10 or the substrate 12 to move on a horizontal surface, by using (i) the elongating/contracting movement of the connecting arms 54a and (ii) the rotational movement of the carrying robot 52 around the axis 52a.

Next, the following describes an arrangement which allows the first carrying section 50 to move straightly. The first carrying section 50 includes: the running path 56; and moving means for allowing the carrying robot 52 to move along the running path. The running path 56 may be a straight-line and be provided at the center of the separating device 100. This makes it possible for the first carrying section 50 to move straightly so as to carry the laminate 10 or the substrate 12.

Subsequently, the following describes, with reference to FIG. 2, a mechanism that the first carrying section 50 supports the laminate 10. In the separating section 100 according to the present embodiment, it is preferable that the first carrying section 50 supports an upper part of the laminate 10.

Specifically, as illustrated in FIGS. 2(A) and (B), the hand 54b holds the laminate 10 by sucking the dicing frame 18 of the laminate 10. For this propose, a sucking mechanism 55a is provided on a surface of the hand 54b which surface faces the laminate 10. It is preferable that a plurality of sucking mechanisms 55a are provided at a position where the hand 54b overlap the dicing frame 18 when the hand 54b is positioned above the dicing frame 18. Further, it is preferable that the hand 54b is provided with a sucking mechanism 55b for a small-diameter dicing frame so as to handle dicing frames 18 (substrates 10) of various sizes. This makes it possible to process laminates 10 of various diameters.

Further, in a case where sucking mechanisms which correspond to two or more dicing frames of different diameters respectively are provided to the hand 54b, it is preferable that one sucking mechanism (e.g., the sucking mechanism 55a in FIG. 2) corresponding to a larger-diameter dicing frame is provided at a position protruded more than a position where another sucking mechanism (e.g., the sucking mechanism 55b in FIG. 2) corresponding to a smaller-diameter dicing frame is provided. This eliminates need for separately controlling depressurization (i.e., suction) in the sucking mechanism 55a and the sucking mechanism 55b. This leads to a simple arrangement of the first carrying section 50.

[Second Processing Section 70]

The second processing section 70 cleans the substrate 12 from which the support plate 14 has been separated. That is, after the adhesive force of the adhesive on the substrate 12 is reduced by the first processing section 30 and the support plate 14 is separated from the substrate 12 by the second carrying section 60, the substrate 12 is carried from the first processing section 30 to the second processing section 70 by the first carrying section 50. The second processing section 70 removes the adhesive remaining on the substrate 12 thus carried, so as to clean the surface of the substrate 12.

An arrangement of the second processing section 70 is not particularly limited, as far as the arrangement allows the second processing section 70 to clean the surface of the substrate 12 without hurting the dicing tape 16 which is exposed. In the present embodiment, a case where a plurality of second processing sections 70 are provided is described as an example. Specifically, a case where the first cleaning unit 72 and the second cleaning unit 74 are provided as the second processing sections 70 is described. In this case, a main purpose of the first cleaning unit 72 is to remove an adhesive remaining on the substrate 12; and a main purpose of the second cleaning unit 74 is to perform final cleaning and drying of the substrate 12. As such, providing a plurality of cleaning units realizes higher-level cleaning (cleaning for obtaining a clean surface).

The first cleaning unit 72 includes: a cleaning plate 76; and hold/movement means 77 which holds the cleaning plate 76 and moves up and down. The cleaning plate 76 is a kind of the opposing plate, and has a surface which faces a process surface of the substrate 12. The opposing surface of the cleaning plate 76 has: a cleaning fluid supplying hole (not illustrated) through which a cleaning fluid is supplied to the substrate 12; and a cleaning fluid suction hole (not illustrated) through which the cleaning fluid thus supplied is sucked. Further, it is preferable for the opposing surface of the cleaning plate 76 to have a size and a shape which are almost the same as those of the process surface of the substrate 12. This makes it possible to perform a cleaning process on the whole process surface of the substrate 12 at once. This allows an effective and uniform cleaning process on the process surface of the substrate 12.

In the first cleaning unit 72, the process may be performed such that (i) the substrate 12 and the cleaning plate 76 are caused to face each other and (ii) supply and suction of a cleaning fluid are performed simultaneously. This prevents the cleaning fluid from splashing onto the dicing tape.

Further, as well as the first processing section 30, it is preferable for the first cleaning unit 72 to include horizontal movement means 78 for allowing horizontal movement. Providing the horizontal movement means 78 to the first cleaning unit 72 allows the cleaning plate 76 to stand by at a position where the cleaning plate 76 does not overlap the processing table 75 when viewed from above. In the present embodiment, the horizontal movement means including (i) a straight-line running path 78a and (ii) a movement mechanism which is provided along the running path 78a is illustrated as an example. However, the horizontal movement means is not limited to this, but only needs to be capable of moving the cleaning plate 76 between a stand-by position and a processing position.

The second cleaning unit 74 further cleans the substrate 12 which has been cleaned by the first cleaning unit 72, and dries the substrate 12 in the end. The second cleaning unit 74 is not limited to any particular type, but only needs to be arranged so as to perform a spin cup cleaning.

[Second Carrying Section 60]

After the first processing section 30 reduces the adhesive force of the adhesive between the substrate 12 and the support plate 14, the second carrying section 60 removes the support plate 14 from the laminate 10, and subsequently carries the support plate 14 to the second storing section 40. The second carrying section 60 includes at least: a sucking plate 62 for sucking and holding an upper part of the support plate 14; hold/movement means 64 for moving the sucking plate 62 up and down; and horizontal movement means 66 for moving the sucking plate 62 in a horizontal direction.

In the second carrying section 60, the sucking plate 62 sucks and holds the support plate 14 which has become removable as a result of the reduction in the adhesive force of the adhesive, so as to remove, from above, the support plate 14 from the substrate 12. Subsequently, the sucking plate 62, which is sucking and holding the support plate 14, is moved horizontally by the horizontal movement means 66, so that the support plate 14 is moved to above the second storing section 40. After that, the sucking plate 62 is caused to stop sucking and holding the support plate 14, so that the support plate 14 is dropped onto the second storing section 40.

With the horizontal movement means 66 of the present embodiment, the support plate 14 is carried horizontally in the second direction along a straight-line elongating from the first processing section 30 to the second storing section 40. The second direction is, specifically, a direction along a straight-line which elongates from (a) the center of the processing table 36 in the first processing section 30 to (b) the center of the cassette station 44 in the second storing section 40. In order to realize such the straight-line movement, the horizontal movement means 66 includes: a running path 66a along the second direction; and a movement mechanism which moves through the running path 66a.

Further, as in the present embodiment, in a case where the second storing section 40 includes the cassette 42, it is preferable that the second carrying section 60 is constituted by the first carrying unit and the second carrying unit. The first carrying unit includes the sucking plate 62, the hold/movement means 64, and the horizontal movement means 66.

The second carrying unit receives the support plate 14 which has been removed from the substrate 12 by that the first carrying unit, and stores the support plate 14 in the cassette 42. The second carrying unit is connected to: a hand 67 for receiving the support plate 14 which is dropped from the first carrying unit; and an arm 69 for supporting the hand 67. Further, the second carrying unit includes horizontal movement means 68 which allows movement on a horizontal surface. After the hand 67 receives the support plate 14, the horizontal movement means 68 carries the support plate 14 to the cassette 42 in which the support plate 14 is stored. Further, the second carrying unit may include, as needed, hold/movement means (not illustrated) for moving the hand 67 up and down.

Furthermore, it is preferable that, in a case where the first carrying unit delivers the support plate 14 to the second carrying unit, a drop distance (i.e., a distance in which a support plate travels during time (a) from when the support plate is released from the sucking plate 62 (b) until when the support plate reaches the hand 67) is short. This is because a short drop distance prevents the support plate 14 from being damaged due to a shock which occurs when the support plate 14 is dropped. The drop distance may be shortened, for example, by the following means. Firstly, the horizontal movement means 66 causes the sucking plate 62 which is sucking and holding the support plate 14 to move to a position above the hand 67 in the second carrying unit. Subsequently, the sucking plate 62 is lowered by the hold/movement means 64 in the first carrying unit. Then, the sucking plate 62 is caused to stop sucking so as to drop the support plate 14. At this time, instead of lowering the sucking plate 62, the hand 67 may be raised by means of the hold/movement means. Needless to say, the drop distance may be shortened only by raising the hand 67. If it is difficult to separate and drop the support plate 14 from the sucking plate 62 only by free-fall, for example, the following means may be used together: (i) providing the sucking plate 62 with a push-down pin (not illustrated) for pushing down the support plate 14 so that the support plate 14 is separated from the sucking plate 62; and (ii) providing gas supplying means (not illustrated) between the sucking plate 62 and the support plate 14 so as to supply gas between the sucking plate 62 and the support plate 14, for the purpose of facilitating separation between the two.

The horizontal movement means 68 in the separating device 100 of the present embodiment includes: a running path for allowing straight-line movement along the second direction; and a movement mechanism which moves through the running path.

In the present embodiment, the second carrying section 60 which moves straightly so as to move the support plate 14 on a horizontal surface is described. However, the present invention is not limited to this. Instead of this, for example, a rotatable carrying mechanism may move the support plate 14 on a horizontal surface.

[Aligning Section 80]

Further, it is preferable for the separating device 100 according to the present embodiment to be provided with the aligning section 80. Before the laminate 10 taken out from the first storing section 20 is carried to the first processing section 30, the aligning section 80 performs an alignment so that the laminate 10 is placed at an appropriate position in the first processing section 30. It is preferable that the aligning section 80 is provided along the running path 56 of the first carrying section 50 (i.e., provided so as to face the running path 56). This is preferable because this allows a highly-accurate alignment by using the following three points: a moving direction of the robot (X); a direction in which the arm is elongated (Y); and rotational of the robot ($\theta$). Further, it is also preferable that the aligning section 80 is positioned along an extension of the running path 56 of the first carrying section 50. This is preferable because this arrangement has the following advantages such as: (i) that space is utilized efficiently; and (ii) that in a case where a plurality of first processing sections to which the laminate 10 is to be carried after an alignment is provided, (a) a distance between the aligning section 80 and one first processing section is equal to (b) a distance between the aligning section 80 and another first processing section.

[Taking-Out/Carrying Section 26]

Further, it is preferable that the separating device 100 according to the present embodiment includes a taking-out/carrying section 26 between the first storing section 20 and the first carrying section 50. The taking-out/carrying section 26 holds the bottom side of the laminate 10, takes out the laminate 10 from the cassette 22, and delivers the laminate 10 to the first carrying section 50. With a support mechanism in which the first carrying section 50 holds the top side of the laminate 10 while carrying the laminate 10, it is impossible to take out the laminate 10 from the cassette 22. On the other hand, if the separating device 100 according to the present embodiment is provided with the taking-out/carrying section 26, it is possible to easily take out the laminate 10 from the cassette 22 even with the first carrying section 50 which holds the top side of the laminate 10 while carrying the laminate 10.

[Cleaning Means]

In the separating device 100 according to the present embodiment, the first processing section 30, the first cleaning unit 72 in the second processing section 70, and the second carrying section 60 include opposing plates, respectively. Each of the opposing plates faces a top surface of the laminate 10, a top surface of the substrate 12, and a top surface of the support plate 14. Specifically, in the first processing section 30, the solvent filling plate 32 corresponds to the opposing plate; in the first cleaning unit 72, the cleaning plate corresponds to the opposing plate; and in the second carrying section 60, the sucking plate corresponds to the opposing plate.

It is preferable that each of the first processing section 30, the first cleaning unit 72 (second processing section 70), and the second carrying section 60 has cleaning means for cleaning the opposing plate. That is, the first processing section 30 includes cleaning means for cleaning the solvent filling plate 32; the first cleaning unit 72 includes cleaning means for cleaning the cleaning plate; and the second carrying section 60 includes cleaning means for cleaning the sucking plate. Thus, these processing and carrying sections which include the opposing plates can clean the opposing surfaces, respectively. This allows carrying in a sophisticated manner. The cleaning means for cleaning the opposing surface can be realized by draining of a solvent. In the first processing section 30 and the first cleaning unit 72, it is possible to drain a solvent through the solvent supplying holes which are provided to the first processing section 30 and the first cleaning unit 72, respectively. Further, in the second carrying section 60, it is preferable that an opposing surface of the sucking plate 62 has a solvent supplying hole (not illustrated). With this, a solvent can be supplied through the solvent supplying hole so as to clean the sucking plate 62.

Figure 3:
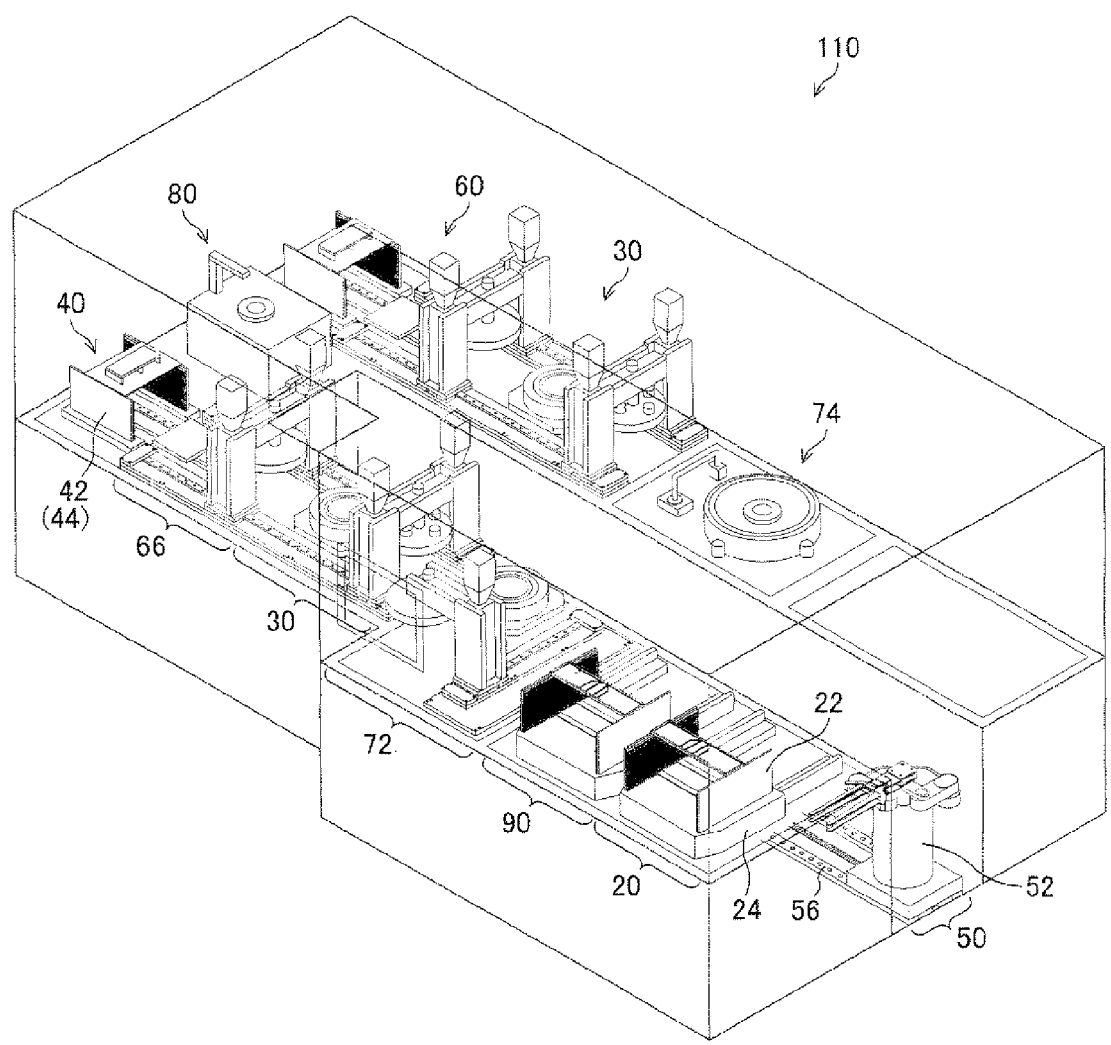
FIG. 3 is a perspective view of one embodiment of the separating device of the present invention.

Next, as another embodiment of a separating device according to the present invention which embodiment is different from the foregoing embodiment, a separating device 110 illustrated in FIG. 3 is described. FIG. 3 is a perspective view of the separating device 110. As well as the foregoing separating device 100, the separating device 110 includes: a first carrying section 50 which moves straightly; a first processing section 30 provided along a running path of the first carrying path 50; a second processing section 70; a first storing section 20; a second storing section 40; a third storing section 90; and a second carrying section 60.

The following describes differences between the separating device 110 and the separating device 100. The separating device 110 is not provided with a taking-out/carrying section 26. That is, the first carrying section 50 includes a carrying robot 52 capable of holding the bottom side of a laminate 10, and thereby the first carrying section 50 can directly take out the laminate from the first carrying section 20. Further, in the separating device 110, horizontal movement means in the first cleaning unit allows straight-line movement along a straight-line extending in a direction so that the straight-line crosses the running path of the first carrying section 50. Note that the other parts in the arrangement of the separating device 110 are common with the separating device 100. Therefore, FIG. 3 can be referred to as a reference view of the separating device 100.

A separating device according to the present invention is not limited to the separating device 100 according to the foregoing embodiment. For example, in the separating device 100 of the foregoing embodiment, the direction (the first direction) of the straight-line movement of the first carrying section 50 is parallel to the direction (the second direction) of the straight-line movement of the second carrying section 60. However, the present invention is not limited to this.

Further, the separating device 100 according to the present embodiment has various types of units (e.g., the processing section and the storing section) along the running path 56 of the first carrying section 50. However, an arrangement of these units is not limited to this. For example, the first processing section 30 may switch positions with the first cleaning unit 72. However, in a device including a plurality of first processing sections 30, it is preferable that the first processing sections 30 are provided so as to sandwich the running path 56 therebetween. This is because this arrangement can improve processing efficiency.

Described so far is the separating device 100 according to the present embodiment using, in combination, the first carrying section 50 which moves straightly and the second carrying section 60. However, the present invention is not limited to this. For example, a separating device according to the present invention may be a separating device including a first carrying section 50 only.

The separating device 100 according to the present embodiment includes the first carrying section 50 which moves straightly. That is, the laminate 10 to be processed may be carried from the first storing section 20 to the first processing section 30 along a straight-line. Therefore, it is possible to provide various processing sections along the running path 56 of the first carrying section 50. This makes it possible to provide a separating device 100 which is capable of performing a process effectively.

Furthermore, the separating device 100 according to the present embodiment can significantly improve efficiency in a process performed on a substrate of a large diameter, compared with a separating device which performs horizontal movement only by means of rotational movement. As a substrate to be processed has a larger diameter, the horizontal movement caused by the rotational movement is restricted more. On the other hand, the separating device 100 according to the present embodiment uses, in addition to the rotational movement, straight-line movement as means for moving on a horizontal surface. This improves the efficiency in the process on the substrate of a large-diameter.

Moreover, in the separating device 100 according to the present embodiment, it is possible to provide various processing sections (e.g., the first processing section and the second processing section of the present embodiment) and various storing sections (e.g., the first storing section and the second storing section of the present embodiment) along and on both sides of the running path 56 of the first carrying section 50. This makes it easier to arrange the device. Further, with this, a new processing section can be added merely by considering a length of the running path. This makes it possible to provide a separating device which is highly flexible in designing.

The present invention is not limited to the description of the embodiments above, but may be altered by a skilled person within the scope of the claims. An embodiment based on a proper combination of technical means disclosed in different embodiments is encompassed in the technical scope of the present invention.

A separating device according to the first embodiment of the present invention includes a first carrying section which moves straightly. Therefore, it is possible to provide a separating device in which a storing section for storing a laminate, a first processing section for reducing adhesive force of an adhesive between a substrate and a support plate, and the like are provided along a running path of the first carrying section. This allows a plurality of various types of processing sections and storing sections to be provided along the running paths regardless of the number or sizes of the processing sections and the storing sections. This makes it possible to provide a separating device in which the whole separating process is automated. Further, according to the present invention, it is possible to improve flexibility in designing of an arrangement of the device.

A separating device according to the second embodiment of the present invention includes, in addition to a first carrying section, a second carrying section for carrying a support plate. This allows efficient removal and storage of the support plate whose adhesive force has been reduced. This makes it possible to provide a separating device having good processing efficiency.

A separating device according to the present invention is capable of efficiently separating a support plate from a substrate of a laminate including the substrate and the support plate.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A separating device for separating a support plate from a substrate of a laminate including the substrate and the support plate bonded to each other, the separating device comprising:
 a first storing section for storing the laminate;
 a plurality of first processing sections for reducing adhesive force of an adhesive applied between the substrate and the support plate;
 a first carrying section which is capable of moving in a first direction and carries the laminate from the first storing section to the first processing sections while holding the laminate; and
 second carrying sections for carrying support plates to second storing sections for storing the support plates, respectively, the support plates having become removable as a result of the reduction in the adhesive force of the adhesive, the reduction being performed by the first processing sections, the first carrying section carrying the laminate by moving straightly, each of the second carrying sections includes (i) a first carrying unit for carrying the support plate from the first processing section and (ii) a second carrying unit for receiving the support plate and carrying, to a corresponding one of the second storing sections, the support plate thus received, the first carrying unit including: a sucking plate for holding the support plate by suction; and hold/movement means for moving the sucking plate up and down.

2. The separating device as set forth in claim 1, wherein:
each of the second carrying sections includes moving means for realizing movement in a second direction along a straight-line elongating from a corresponding one of the first processing sections to said each of the second storing sections.

3. The separating device as set forth in claim 2, wherein:
the first direction is parallel to the second direction.

4. The separating device as set forth in claim 1 wherein:
the plurality of first processing sections are provided along a running path through which the first carrying section moves in the first direction.

5. The separating device as set forth in claim 4, wherein:
the plurality of first processing sections sandwich the running path therebetween.

6. The separating device as set forth in claim 1, wherein:
each of the second carrying sections carries the support plate while holding a top side of the support plate.

7. The separating device as set forth in claim 1, wherein:
the first carrying section carries the laminate while holding a top side of the laminate.

8. The separating device as set forth in claim 1, further comprising a second processing section for cleaning the substrate from which the support plate has been separated.

9. The separating device as set forth in claim 8, wherein:
each of the first processing sections, the second processing section, and the first carrying section have, respectively, an opposing plate having a surface which faces a top surface of the laminate, a top surface of the substrate, and a top surface of the support plate.

10. The separating device as set forth in claim 9, wherein:
at least one of the first processing sections, the second processing section, or the first carrying section has cleaning means for cleaning the opposing plate.

11. The separating device as set forth in claim 1, further comprising:
a cassette, provided in the first storing section, for storing a plurality of laminates therein; and a taking-out/carrying section, provided between the first storing section and the first carrying section, for taking out each of the laminates from the cassette while holding a bottom side of each of the laminates.

12. The separating device as set forth in claim 1, further comprising an aligning section for aligning the laminate along an extension of a running path of the first carrying section.

13. The separating device as set forth in claim 1, wherein:
the substrate of the laminate includes a thinned substrate; and
the support plate is to be separated from the thinned substrate.

14. The separating device as set forth in claim 1,
wherein:
the second carrying unit includes:
a hand for receiving the substrate which is dropped from the first carrying unit; and
hold/movement means for moving the hand up and down.

15. A separating device for separating a support plate from a first laminate including a substrate and the support plate bonded to each other, the separating device comprising:
a first storing section for storing the laminate;
a first processing section for reducing adhesive force of an adhesive applied between the substrate and the support plate;
a second storing section for storing the support plate which has been separated from the substrate;
a first carrying section for carrying the laminate from the first storing section to the first processing section while holding the laminate; and
a second carrying section for carrying, to the second storing section, the support plate which has become removable as a result of the reduction in the adhesive force of the adhesive, the reduction being performed by the first processing section;
each of the second carrying sections includes (i) a first carrying unit for carrying the support plate from the first processing section and (ii) a second carrying unit for receiving the support plate and carrying, to a corresponding one of the second storing sections, the support plate thus received,
the first carrying unit including: a sucking plate for holding the support plate by suction; and hold/movement means for moving the sucking plate up and down.

16. The separating device as set forth in claim 15, wherein the second carrying unit includes:
a hand for receiving the support plate which is dropped from the first carrying unit; and
hold/movement means for moving the hand up and down.

* * * * *